United States Patent
Hung et al.

(10) Patent No.: US 9,269,574 B2
(45) Date of Patent: Feb. 23, 2016

(54) METHODS OF FABRICATING DIELECTRIC FILMS FROM METAL AMIDINATE PRECURSORS

(71) Applicants: Steven Hung, Sunnyvale, CA (US); Atif Noori, Saratoga, CA (US); David Thompson, San Jose, CA (US); Yoshihide Senzaki, Aptos, CA (US)

(72) Inventors: Steven Hung, Sunnyvale, CA (US); Atif Noori, Saratoga, CA (US); David Thompson, San Jose, CA (US); Yoshihide Senzaki, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/869,182

(22) Filed: Apr. 24, 2013

(65) Prior Publication Data

US 2013/0288427 A1  Oct. 31, 2013

Related U.S. Application Data

(60) Provisional application No. 61/638,194, filed on Apr. 25, 2012.

(51) Int. Cl.
| | |
|---|---|
| *C23C 16/40* | (2006.01) |
| *H01L 21/02* | (2006.01) |
| *C23C 16/455* | (2006.01) |
| *H01L 21/28* | (2006.01) |
| *H01L 29/51* | (2006.01) |

(52) U.S. Cl.
CPC .......... *H01L 21/02565* (2013.01); *C23C 16/40* (2013.01); *C23C 16/45531* (2013.01); *C23C 16/45553* (2013.01); *H01L 21/0228* (2013.01); *H01L 21/02181* (2013.01); *H01L 21/02186* (2013.01); *H01L 21/02189* (2013.01); *H01L 21/02192* (2013.01); *H01L 21/02194* (2013.01); *H01L 21/02274* (2013.01); *H01L 21/28194* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 6,878,206 | B2 | 4/2005 | Tzu et al. |
| 6,916,398 | B2 | 7/2005 | Chen et al. |
| 7,470,470 | B2 | 12/2008 | Senzaki et al. |
| 7,638,645 | B2 | 12/2009 | Gordon et al. |
| 7,780,785 | B2 | 8/2010 | Chen et al. |
| 8,071,452 | B2 | 12/2011 | Raisanen |
| 2001/0042505 | A1 | 11/2001 | Vaartstra |
| 2005/0277223 | A1 | 12/2005 | Lee et al. |
| 2005/0285103 | A1* | 12/2005 | Ahn et al. ............ 257/43 |
| 2006/0035462 | A1 | 2/2006 | Millward |
| 2007/0155190 | A1* | 7/2007 | Vaartstra et al. ......... 438/789 |
| 2009/0079015 | A1 | 3/2009 | Bhattacharyya |
| 2009/0203222 | A1 | 8/2009 | Dussarrat |

FOREIGN PATENT DOCUMENTS

WO   WO2009143456   * 11/2009   ............ C23C 16/405

OTHER PUBLICATIONS

Utah Valley University: OChemPal, "Acyl Group" <http://science.uvu.edu/ochem/index.php/alphabetical/a-b/acyl-group/> accessed May 12, 2015.*
PCT International Search Report & Written Opinion in PCT/US2013/038063, Aug. 12, 2013, 13 pgs.
PCT International Preliminary Report on Patentability in PCT/US2013/038063, mailed Nov. 6, 2014, 9 pages.

* cited by examiner

*Primary Examiner* — Mandy Louie
(74) *Attorney, Agent, or Firm* — Servillia Whitney LLC

(57) ABSTRACT

Described are methods for atomic layer deposition of films comprising mixed metal oxides using metal amidinate precursors. The mixed metal oxide films may comprise a lanthanide and a transition metal such as hafnium, zirconium or titanium. Such mixed metal oxide films may be used as dielectric layers in capacitors, transistors, dynamic random access memory cells, resistive random access memory cells, flash memory cells and display panels.

7 Claims, No Drawings

METHODS OF FABRICATING DIELECTRIC FILMS FROM METAL AMIDINATE PRECURSORS

CROSS-REFERENCE TO RELATED APPLICATIONS

This application claims the benefit under 35 U.S.C. §119(e) to U.S. Provisional Application No. 61/638,194, filed Apr. 25, 2012, the entire content of which is incorporated herein by reference in its entirety.

TECHNICAL FIELD

Embodiments of the present invention generally relate to the field of semiconductor manufacturing processes and devices, particularly to methods of depositing dielectric films and use of such films in electronic devices.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide ($SiO_2$), silicon oxynitride (SiON), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like).

Replacement of polysilicon as a traditional material of the gate electrode with metals and metal-containing compounds reduces undesired voltage drops associated with the polysilicon depletion effect, as well as increases drive current performance and the operational speed of the CMOS transistor.

The gate oxide, which serves as insulator between the gate and channel, should be made as thin as possible to increase the channel conductivity and performance when the transistor is on and to reduce subthreshold leakage when the transistor is off. However, with current gate oxides with a thickness of around 1.2 nm, the quantum mechanical phenomenon of electron tunneling occurs between the gate and channel, leading to increased power consumption.

High-k dielectrics that have a larger dielectric constant than silicon dioxide are being used to reduce the gate leakage, such as hafnium oxide ($HfO_2$). Increasing the dielectric constant of the gate dielectric allows a thicker layer while maintaining a high capacitance. Generally, a higher dielectric thickness reduces the quantum tunneling current through the dielectric between the gate and the channel. However, the difference in conduction band energy between the semiconductor and the dielectric (and the corresponding difference in valence band energy) impacts leakage current level. For the traditional gate oxide, silicon dioxide, the former barrier is approximately 8 eV. For many alternative dielectrics, the value is significantly lower, tending to increase the tunneling current, somewhat negating the advantage of higher dielectric constant.

As mentioned above, alternative materials have been proposed for use as gate dielectric materials. Although improvements to semiconductor gate electrodes have been made through the use of alternative gate metals and gate dielectric materials, further improvements are desired to improve the performance of integrated circuit devices, for example, to reduce leakage current density.

Thus, there is an ongoing need in the art for methods of rapidly and efficiently depositing dielectric films.

SUMMARY

One aspect of the invention pertains to a method of depositing a film, the method comprising sequentially exposing a surface of a substrate to alternating pulses of a first metal precursor and an oxidant to provide a first metal oxide film, and sequentially exposing the first metal oxide film to alternating pulses of an oxidant and a second metal precursor to provide a film comprising a mixed metal oxide of the first metal and the second metal. In embodiments of this aspect, the first metal is one or more transition metals, such as Hf, Zr or Ti. The second metal precursor may be a lanthanide amidinate precursor or a lanthanide guanidinate precursor. According to one or more embodiments, the lanthanide is cerium.

The first metal precursor may also be an amidinate or guanidinate precursor, such as one having the formula $M_1L_n$, wherein $M_1$ is selected from Hf, Zr and Ti, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-4, and with each L independently being the same or different ligand as another L. In some embodiments, one or more L's is another amidinate or guanidinate ligand.

The lanthanide amidinate precursor or the lanthanide guanidinate precursor may have a structure represented by:

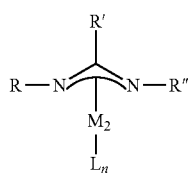

wherein M₂ is a lanthanide, R, R' and R" are each independently hydrogen, $C_{1-8}$ alkyl, aryl, acyl, aldehyde, keto, $C_{2-4}$ alkenyl, alkynyl, nitrogen, amino, or $CF_3$, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-3, and with each L independently being the same or different ligand as another L. In some embodiments, one or more L's is another amidinate or guanidinate ligand.

According to one or more embodiments, the film comprising a mixed metal oxide is a mixed metal oxide film, a mixed metal oxynitride film, a mixed metal silicate film, or a nitrided mixed metal silicate film.

The film comprising a mixed metal oxide may comprise 1 to 30 mole percent lanthanide, based on the total moles of lanthanide and transition metal in the film. In some embodiments, the lanthanide is cerium and the transition metal is hafnium.

The oxidant may comprise one or more of $H_2O$, $H_2O_2$, $O_2$, $O_3$, $N_2O$, NO, NOx, a nitrate, an alcohol, a carboxylic acid, CO, $CO_2$, and HCOH.

In some embodiments, the film comprising a mixed metal oxide film may be annealed after deposition.

Another aspect of the present invention pertains to a method of depositing a film, the comprising sequentially exposing a surface of a substrate to alternating pulses of an oxidant and a precursor mixture comprising a first metal precursor and a second metal precursor to provide a film comprising a mixed metal oxide of the first and second metals. In embodiments of this aspect, the first metal is one or more transition metals, such as Hf, Zr or Ti. The second metal precursor may be a lanthanide amidinate precursor or a lanthanide guanidinate precursor. According to one or more embodiments, the lanthanide is cerium.

The first metal precursor may also be an amidinate or guanidinate precursor, such as one having the formula $M_1L_n$, wherein $M_1$ is selected from Hf, Zr and Ti, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-4, and with each L independently being the same or different ligand as another L. In some embodiments, one or more L's is another amidinate or guanidinate ligand.

The lanthanide amidinate precursor or the lanthanide guanidinate precursor may have a structure represented by:

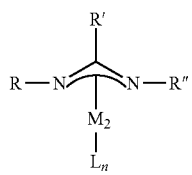

wherein M₂ is a lanthanide, R, R' and R" are each independently hydrogen, $C_{1-8}$ alkyl, aryl, acyl, aldehyde, keto, $C_{2-4}$ alkenyl, alkynyl, nitrogen, amino, or $CF_3$, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-3, and with each L independently being the same or different ligand as another L. In some embodiments, one or more L's is another amidinate or guanidinate ligand.

According to one or more embodiments of this aspect, the film comprising a mixed metal oxide is a mixed metal oxide film, a mixed metal oxynitride film, a mixed metal silicate film, or a nitrided mixed metal silicate film.

The first metal precursor and the second metal precursor may mixed prior to introducing the first metal precursor and the second metal precursor into the deposition chamber, or the precursors may be in the chamber itself. In some embodiments, the molar ratio of the first metal precursor to the second metal precursor in the precursor mixture is in the range from 100:1 to 2:1.

The oxidant may comprise one or more of $H_2O$, $H_2O_2$, $O_2$, $O_3$, $N_2O$, NO, NOx, a nitrate, an alcohol, a carboxylic acid, CO, $CO_2$, and HCOH.

Yet another aspect of the present invention pertains to a method of depositing a film comprising a mixed metal oxide, the method comprising controlling the flows of a first metal precursor and a second metal precursor to provide a precursor mixture, exposing a surface of a substrate to the precursor mixture, and exposing the surface of the substrate to an oxidant to provide a film comprising a mixed metal oxide of the first and second metals.

In embodiments of this aspect, the first metal is one or more transition metals, such as Hf, Zr or Ti. The second metal precursor may be a lanthanide amidinate precursor or a lanthanide guanidinate precursor. According to one or more embodiments, the lanthanide is cerium.

The first metal precursor may also be an amidinate or guanidinate precursor, such as one having the formula $M_1L_n$, wherein $M_1$ is selected from Hf, Zr and Ti, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-4, and with each L independently being the same or different ligand as another L. In some embodiments, one or more L's is another amidinate or guanidinate ligand.

The lanthanide amidinate precursor or the lanthanide guanidinate precursor may have a structure represented by:

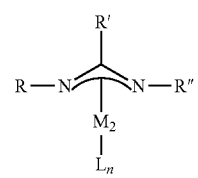

wherein M₂ is a lanthanide, R, R' and R" are each independently hydrogen, $C_{1-8}$ alkyl, aryl, acyl, aldehyde, keto, $C_{2-4}$ alkenyl, alkynyl, nitrogen, amino, or $CF_3$, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-3, and with each L independently being the same or different ligand as another L. In some embodiments, one or more L's is another amidinate or guanidinate ligand.

According to one or more embodiments of this aspect, the film comprising a mixed metal oxide is a mixed metal oxide film, a mixed metal oxynitride film, a mixed metal silicate film, or a nitrided mixed metal silicate film.

In one or more embodiments, the flows of the first metal precursor and the second metal precursor are controlled to provide a mixed metal oxide film comprising 1 to 30 mole percent lanthanide, based on the total moles of lanthanide and first metal in the film.

Another aspect relates to an electronic device containing a dielectric layer comprising a mixed metal oxide film deposited according to any of the methods described herein. The dielectric layer may be in communication with a conductive layer. In some embodiments, the electronic device may be a capacitor, a transistor, a dynamic random access memory cell, a resistive random access memory cell, a flash memory cell or a display panel.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

DETAILED DESCRIPTION

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In accordance with various embodiments of the invention, provided are methods related to the deposition of films comprising mixed metal oxides. The mixed metal oxides films comprise a lanthanide and a transition metal such as hafnium, zirconium and/or titanium. In one or more embodiments, the lanthanide is cerium. Some embodiments provide that the transition metal is hafnium.

These mixed metal oxides may be used as the gate dielectric in transistors, or as dielectrics in capacitors, dynamic random access memory cells, resistive random access memory cells, flash memory cells and display panels.

One aspect of the current invention provides a method of depositing a film comprising a mixed metal oxide by using a lanthanide amidinate or a lanthanide guanidinate precursor. In embodiments of this aspect, the method comprises sequentially exposing a surface of a substrate to alternating pulses of a first metal precursor and an oxidant to provide a first metal oxide film on the substrate surface, and sequentially exposing the first metal oxide film to alternating pulses of an oxidant and a lanthanide precursor. The lanthanide precursor may be a lanthanide amidinate or a lanthanide guanidinate precursor having the following structure:

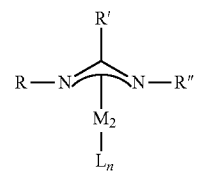

wherein $M_2$ is a lanthanide, and R, R' and R" are each independently hydrogen, $C_{1-8}$ alkyl, aryl, acyl, aldehyde, keto, $C_{2-4}$ alkenyl, alkynyl, nitrogen, amino, or $CF_3$. $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-3, and each L independently is the same or different ligand as another L. In some embodiments, each L is the same amidinate or guanidinate ligand such that the metal complex is homoleptic. In other embodiments, at least L is not the same as the amidinate or guanidinate ligand, and the metal complex is heteroleptic. According to one or more embodiments, the lanthanide comprises cerium.

The first metal may be a transition metal, and in some embodiments, the first metal is one or more of hafnium, zirconium and titanium. Like the lanthanide precursor, the first metal precursor may also be an amidinate or guanidinate precursor. In some embodiments, the first metal precursor has a formula represented by $M_1L_n$, wherein $M_1$ is selected from Hf, Zr and Ti, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-4, and each L independently is the same or different ligand as another L. In some embodiments, each L is the same amidinate or guanidinate ligand such that the metal complex is homoleptic. In other embodiments, at least L is not the same as the amidinate or guanidinate ligand, and the metal complex is heteroleptic. According to one or more embodiments, the transition metal comprises hafnium.

Metal amidinate and metal guanidinate precursors may be prepared by salt metathesis reactions in which a metal halide is reacted with a corresponding lithium salt of an amidine or a guanidine.

The oxidants used for the transition metal oxide and the lanthanide oxide may be the same or different. Suitable oxidants include, but are not limited to, $H_2O$, $H_2O_2$, $O_2$, $O_3$, $N_2O$, NO, NOx, nitrates, alcohols, carboxylic acids, CO, $CO_2$, and HCOH. In order to help meet stringent requirements for equivalent oxide thickness (EOT) scaling well below 1 nm for gate dielectrics, some embodiments provide that less strong oxidants are used. Accordingly, in some embodiments the oxidant comprises water.

The film comprising the mixed metal oxide may be any film containing the transition metal, the lanthanide and oxygen. In some embodiments, the film comprising a mixed metal oxide may be a mixed metal oxide film, a mixed metal oxynitride film, a mixed metal silicate film, or a nitrided mixed metal silicate film.

Lanthanide amidinate and guanidinate precursors may provide many advantages over other lanthanide precursors. Prior to the present invention, there was a lack of available water reactive chemistries that leave low carbon residue in the lanthanide-containing films. Also, other known cerium-containing compounds, such as tetrakis(2,2,6,6-tetramethyl-3,5-heptanedione)cerium (Ce(thd)$_4$) and tris(isopropylcyclopentadienyl)cerium (Ce(iPrCp)$_3$) have low vapor pressures and require extensive heating to provide a sufficient vapor pressure of the chemicals to be utilized in atomic layer deposition (ALD) or chemical vapor deposition (CVD) processing. Such heating tends to cause decomposition of the precursors prematurely, and therefore, renders these sources unsuitable for ALD or CVD processing. Furthermore, dielectric films deposited using lanthanide amidinate and guanidinate precursors may have reduced leakage current density compared to dielectric films deposited using other precursors. For example, HfCeOx films deposited using cerium amidinate precursors showed 10 to 60-fold reduction in current density compared to HfCeOx films deposited using 1-methoxy-2-methyl-2-propoxide (mmp) precursors of cerium.

In one embodiment, films are deposited using an atomic layer deposition (ALD) process. In exemplary embodiment of an ALD process, a first chemical precursor ("A") is pulsed, for example a transition metal precursor, to the substrate surface in a first half reaction. A first chemical precursor "A" is selected so it reacts with suitable underlying species (for example OH or NH functionality on the surface) to form a new self-saturating surface. However, surface functionality is not necessarily required for certain reactants. Excess unused reactants and the reaction by-products are removed, typically by an evacuation-pump down and/or by a flowing inert purge gas. Then a co-reactant "B", for example an oxidant, is delivered to the surface, wherein the previously reacted terminating substituents or ligands of the first half reaction are reacted with new ligands or substituents from the "B" co-reactant, creating an exchange by-product. The "B" co-reactant also forms self-saturating bonds with the underlying reactive species to provide another self-limiting and saturating second half reaction. A second purge period is typically utilized to remove unused reactants and the reaction by-products.

The "A" precursor, "B" co-reactants and purge gases can then again be flowed. The alternating exposure of the surface to reactants "A" and "B" is continued until the desired thickness film is reached. In order to incorporate the second metal (i.e. the lanthanide), a third chemical precursor "C" is flowed, such as a lanthanide amidinate or lanthanide guanidinate precursor. Then a co-reactant "D", for example an oxidant, is delivered to the surface. The "D" reactant may be the same oxidant as the "B" reactant, or may be a different oxidant. The sequence of pulses for "A", "B", "C" and "D" gases may be varied depending on the desired composition of the film. One exemplary sequence that would be A-B-C-D-A-B-C-D, which would provide a film with a 1:1 molar ratio of the transition metal to the lanthanide. Other exemplary sequences may be A-B-A-B-C-D-A-B, A-B-A-B-A-B-C-D-A-B, etc.

In one or more embodiments, the lanthanide ratio is selected to enhance k values or reduce the leakage of the dielectric. The lanthanide ratio is the ratio of the moles of the lanthanide to the sum of moles of the lanthanide and the transition metal. Some embodiments provide that the lanthanide ratio is 0.01 to 0.3, i.e. the film comprising the mixed metal oxide contains 1 to 30% lanthanide, based on the total moles of lanthanide and transition metal.

It will be understood that the "A", "B", "C", "D" and purge gases can flow simultaneously, and the substrate and/or gas flow nozzle can oscillate such that the substrate is sequentially exposed to the A, B, C, D and purge gases as desired.

The precursors and/or reactants may be in a state of gas, plasma, vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

Thus, in one or more embodiments, alternating pulses or flows of "A" precursor and "B" co-reactant can be used to deposit a film, for example, in a pulsed delivery of multiple cycles of pulsed precursors and co-reactants, for example, A pulse, B co-reactant pulse, A precursor pulse, B co-reactant pulse, A precursor pulse, B co-reactant pulse, A precursor pulse, B co-reactant pulse. As noted above, instead of pulsing the reactants, the gases can flow simultaneously from a gas delivery head or nozzle and the substrate and/or gas delivery head can be moved such that the substrate is sequentially exposed to the gases.

Of course, the aforementioned ALD cycles are merely exemplary of a wide variety of ALD process cycles in which a deposited layer is formed by alternating layers of precursors and co-reactants. Although specific reference is made to the "A" reactant being a transition metal precursor, the first reactant in the ALD cycle may be the oxidant or the lanthanide precursor.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

The films in accordance with various embodiments of this invention can be deposited over virtually any substrate material. As the ALD processes described herein are low-temperature, it is particularly advantageous to use these processes with substrates that are thermally unstable. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming film containing mixed metal oxides, a processing chamber is configured to expose the substrate to a sequence of gases and/or plasmas during the vapor deposition process. The processing chamber would include separate supplies of the A and B reactants, or the C and D reactants, or all of the A, B, C and D reactants. The processing chamber would also include along any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a ALD process as described herein. Central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. Plasmas may be useful for depositing, forming, annealing, treating, or other processing of the films described herein. The various plasmas described herein, such as a nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a film containing a mixed metal oxide may be formed during plasma enhanced atomic layer deposition (PEALD) process that provides sequential pulses of a precursor(s) and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus, in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the ALD processes disclosed herein, it should be noted that plasmas are not required. Indeed, other embodiments relate to ALD under very mild conditions without a plasma.

Thus, another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of a lanthanide amidinate or lanthanide guanidinate precursor. The apparatus also includes a reactant gas inlet in fluid communication with a supply of an oxidant, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785.

The ALD process provides that the processing chamber or the deposition chamber may be pressurized at a pressure within a range from about 0.01 Torr to about 100 Torr, for example from about 0.1 Torr to about 10 Torr. Also, according to one or more embodiments, the chamber or the substrate may be heated such that deposition can take place at a temperature lower than about 300° C. In other embodiments, deposition may take place at temperatures lower than about 100° C., and in others, even as low as about room temperature. In one embodiment, deposition is carried out at a temperature range of about 150° C. to 350° C.

A substrate can be any type of substrate described above. An optional process step involves preparation of a substrate by treating the substrate with a plasma or other suitable surface treatment to provide active sites on the surface of the substrate. Examples of suitable active sites include, but are not limited to O—H, N—H, or S—H terminated surfaces.

Delivery of "A" Precursor to Substrate Surface

The substrate can be exposed to the "A" precursor gas or vapor formed by passing a carrier gas (for example, nitrogen or argon) through an ampoule of the precursor, which may be in liquid form. The ampoule may be heated. Alternatively, the precursors may be dissolved in a solvent and used for direct liquid injection and flash vaporization. Suitable solvents include hydrocarbons, alkyl amines and alcohols. When direct liquid injection and flash vaporization is used, there is no need to heat the precursor solution until the liquid is transported to the vaporize, which improves the shelf life of precursor solutions.

The "A" precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing "A" precursor gas for a time period within a range from about 0.1 seconds to about 10 seconds, for example, from about 1 second to about 5 seconds, and in a specific example, for approximately 2 seconds. The flow of the "A" precursor gas is stopped once the precursor has adsorbed onto all reactive surface moieties on the substrate surface. In an ideally behaved ALD process, the surface is readily saturated with the reactive precursor "A" such that additional exposure would not result in additional deposition (i.e. the process is self-limiting due to the consumption of all reactive surface moieties).

First Purge

The substrate and chamber may be exposed to a purge step after stopping the flow of the "A" precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 15 seconds, for example, from about 1 second to about 10 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. Pumping may be used, in addition to the purge steps, to enhance the evacuation efficiency.

Delivery of "B" co-reactant to Substrate Surface

After the first purge, the substrate active sites can be exposed a "B" co-reactant gas or vapor formed by passing a carrier gas (for example, nitrogen or argon) through an ampoule the "B" co-reactant. The ampoule may be heated. The "B" reactant gas can be delivered at any suitable flow rate within a range from about 10 sccm to about 2,000 sccm, for example, from about 50 sccm to about 1,000 sccm, and in specific embodiments, at about 200 sccm. The substrate may be exposed to the "B" reactant gas for a time period within a range from about 0.1 seconds to about 8 seconds, for example, from about 1 second to about 5 seconds, and in a specific example, for about 2 seconds. The flow of the "B" reactant gas may be stopped once "B" has adsorbed onto and reacted with readily "A" precursor deposited in the preceding step.

Second Purge

The substrate and chamber may be exposed to a purge step after stopping the flow of the "B" co-reactant gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen. The "B" co-reactant gas may also be in the form of a plasma generated remotely from the process chamber. Pumping may be used, in addition to the purge steps, to enhance the evacuation efficiency.

The "C" and "D" reactants may be delivered in the same manner as described above for the "A" and "B" reactants.

After the film containing a mixed metal oxide has been deposited, the film may be annealed to homogenize the film. Annealing conditions may be in a temperature range of about 200° C. to 1000° C., such as 300° C. to 800° C., and more specifically 400° C. to 700° C. with a duration of 0.1 seconds to 60 seconds, such as 1 to 30 seconds, more specifically 2 to 10 seconds. A rapid thermal anneal process including spike anneal (i.e. short abrupt anneal) may be preferred to minimize undesirable interfacial oxide layer growth between the metal oxides and the substrate. The ambient gas for anneal may contain, but is not limited to, nitrogen, hydrogen, argon, neon, helium, forming gas ($H_2/N_2$) $H_2O$, $H_2O_2$, $O_2$, $O_3$, $N_2O$, NO, NOx, nitrates, alcohols, carboxylic acids, CO, $CO_2$, and HCOH, or combinations thereof. In one or more embodiments, the carrier gas comprises nitrogen.

Another aspect of the present invention relates to a method of depositing a film containing a mixed metal oxide by using a precursor mixture. In one or more embodiments of this aspect, the method comprises sequentially exposing the substrate surface to alternating pulses of an oxidant and a precursor mixture. The precursor mixture comprises a first metal precursor, such as a transition metal precursor, and a second metal precursor, such as a lanthanide amidinate or guanidinate precursor. These precursors may be any of those described above with respect to the first aspect.

Co-flowing a precursor mixture may have several advantages over depositing transition metal and lanthanide layers separately in a nanolamination process. The ratio of the first metal to the second metal in the mixed metal oxide film can be controlled by controlling the ratio of the two precursors in the mixture. The final composition of the film will depend on the ratio of the two precursors, as well their relative reactivities. According to one or more embodiments, the molar ratio of the transition metal precursor to the lanthanide precursor in the precursor mixture is in the range from 100:1 to 2:1 or from 20:1 to 5:1. In some embodiments, the transition metal is hafnium and the lanthanide is cerium, and the molar ratio of the hafnium precursor to the cerium precursor is from 100:1 to 2:1 or from 20:1 to 5:1.

Another potential advantage is that homogenous mixed metal oxide films may be directly deposited, which may reduce the need for post-deposition annealing or may lower the post-deposition annealing temperature. Furthermore, a simple 4 step cycle may be used (precursor mixture pulse, purge, oxidant pulse, purge), instead of a more complicated deposition procedure with 8 or more steps (first metal precursor pulse, purge, oxidant pulse, purge, second metal precursor pulse, purge, oxidant pulse, purge).

In some embodiments, the ligands of the first metal precursor and the second metal precursor are selected for compatibility to prevent gas phase reactions. For example, both the first and second metal precursors may be amidinate or guanidinate precursors.

The precursors may be introduced into the deposition chamber prior to mixing, or the precursors may be mixed prior to introducing into the deposition chamber. In some embodiments, the precursors are mixed prior to introducing into the deposition chamber to provide a homogenous precursor mixture.

Another aspect of the present invention pertains to a method of depositing a film comprising a mixed metal oxide, the method comprising controlling the flows of a first metal precursor and a second metal precursor to provide a precursor mixture, and then exposing the surface of a substrate the precursor mixture. In embodiments of this aspect, the first metal is a transition metal (such as Hf, Zr and/or Ti), and the second metal precursor is a lanthanide amidinate precursor or a lanthanide guanidinate precursor. The substrate is also exposed to an oxidant to provide a film containing a mixed metal oxide of the first and second metals.

The precursors for use in this aspect may be any of the precursors described above. In some embodiments, the first metal precursor is also an amidinate or guanidinate precursor.

Yet another aspect of the invention relates to electronic devices comprising mixed metal oxides deposited according to any of the methods described herein. The mixed metal oxides may be used as the dielectric in these electronic devices, and may be in communication with a conductive layer in the device. Examples of electronic devices in which these mixed metal oxide films may be used are capacitors, transistors, dynamic random access memory cells, resistive random access memory cells, flash memory cells and display panels.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of depositing a film comprising:
sequentially exposing a surface of a substrate to alternating pulses of a first metal precursor and an oxidant to provide a first metal oxide film on the substrate surface, wherein the first metal is one or more of Hf, Zr or Ti; and
sequentially exposing the first metal oxide film to alternating pulses of an oxidant and a cerium amidinate precursor to provide a film comprising a mixed metal oxide of the first metal and cerium, wherein the cerium amidinate precursor has a structure represented by:

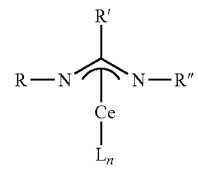

wherein R, R' and R'' are each independently hydrogen, $C_{1-8}$ alkyl, aryl, acyl, aldehyde, keto, $C_{2-4}$ alkenyl, alkynyl, or $CF_3$, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-3, and with each L independently being the same or different ligand as another L.

2. The method of claim 1, wherein the first metal precursor has a formula represented by $M_1L_n$, wherein $M_1$ is selected from Hf, Zr and Ti, $L_n$ are n ligands selected from one or more of hydride, alkylamide, dialkylamide, alkoxide, beta-diketonate, ketoiminate, cyclopentadienyl, $C_{1-8}$ alkyl, $C_{2-8}$ alkenyl, $C_{2-8}$ alkynyl, $CF_3$, halide, imidazolate, pyridinium, amidinate and guanidinate, n is a number from 1-4, and with each L independently being the same or different ligand as another L.

3. The method of claim 1, wherein the film comprising a mixed metal oxide is a mixed metal oxide film, a mixed metal oxynitride film, a mixed metal silicate film, or a nitrided mixed metal silicate film.

4. The method of claim 1, wherein the first metal is Hf.

5. The method of claim 4, wherein the mixed metal oxide film comprises 1 to 30 mole percent cerium, based on the total moles of cerium and hafnium in the film.

6. The method of claim 1, wherein the oxidant comprises one or more of $H_2O$, $H_2O_2$, $O_2$, $O_3$, $N_2O$, NO, NOx, a nitrate, an alcohol, a carboxylic acid, CO, $CO_2$, and HCOH.

7. The method of claim 1, further comprising annealing the mixed metal oxide film.

\* \* \* \* \*